United States Patent [19]
Ziv et al.

[11] Patent Number: 4,918,390
[45] Date of Patent: Apr. 17, 1990

[54] METHOD AND SYSTEM FOR MONITORING THE CONDITION OF A PLURALITY OF ELECTRICAL DEVICES

[76] Inventors: Pinhas Ziv, 31 Adirim Street, Tel Aviv; Michael Steiner, 36 Azar Street, Ramat Hasharon, both of Israel

[21] Appl. No.: 337,676

[22] Filed: Apr. 13, 1989

[51] Int. Cl.$^4$ .............................................. G01R 31/02
[52] U.S. Cl. ................................... 324/415; 340/639; 340/644
[58] Field of Search ................ 340/644, 639; 324/415, 324/418, 523, 537, 422

[56] References Cited
U.S. PATENT DOCUMENTS

| | | | |
|---|---|---|---|
| 2,317,030 | 4/1943 | Colvin | 340/639 |
| 2,833,983 | 5/1958 | Shaw | 324/422 |
| 4,764,884 | 8/1988 | Noyori | 340/644 |

OTHER PUBLICATIONS
IBM Technical Disclosure Bulletin, vol. 13, No. 3, Aug. 1970, Carey et al.

*Primary Examiner*—Reinhard J. Eisenzopf
*Assistant Examiner*—Maura K. Regan
*Attorney, Agent, or Firm*—Benjamin J. Barish

[57] ABSTRACT

A method and system for monitoring the condition of a plurality of electrical devices, particularly electrical switches actuated by sensors, to determine the condition of each and the location of e.g., a malfunctioning device. The electrical devices are connected in parallel across a pair of line conductors. A voltage-dropping element is inserted in series with the line at the input side of each device, and a current-limiting element, passing a fixed current independently of voltage above a predetermined threshold, is inserted in series with the respective device. Initially, a voltage is applied to the line of greater magnitude than the sum of the predetermined threshold and the voltage of the first device, and is sequentially increased in a plurality of steps, while the current passing through the line initially and after each of the voltage steps is measured.

21 Claims, 4 Drawing Sheets

FIG 1
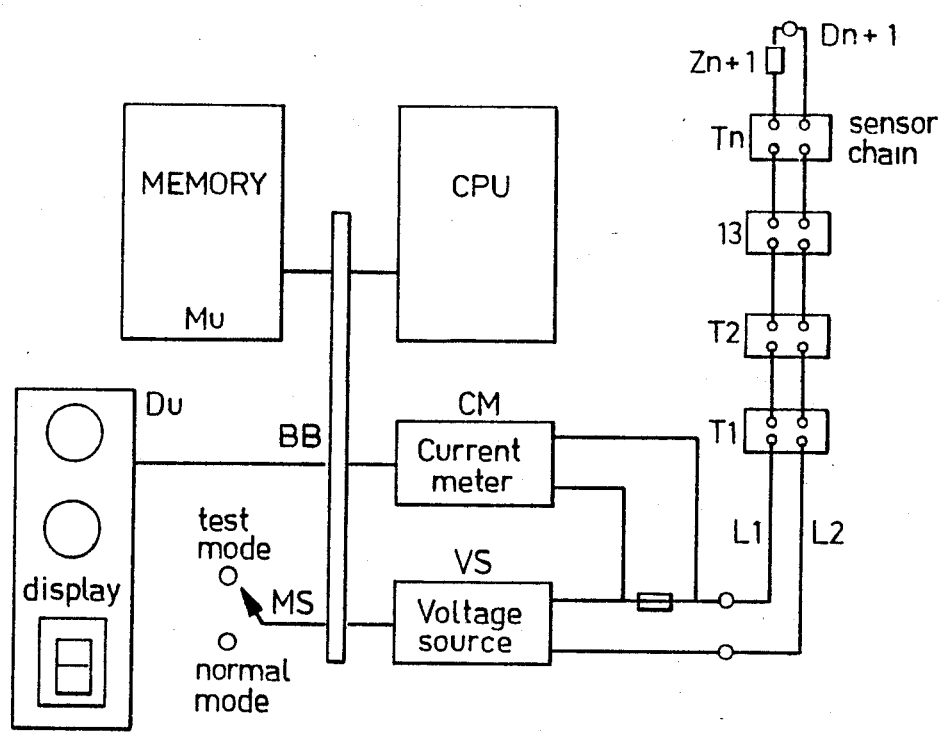
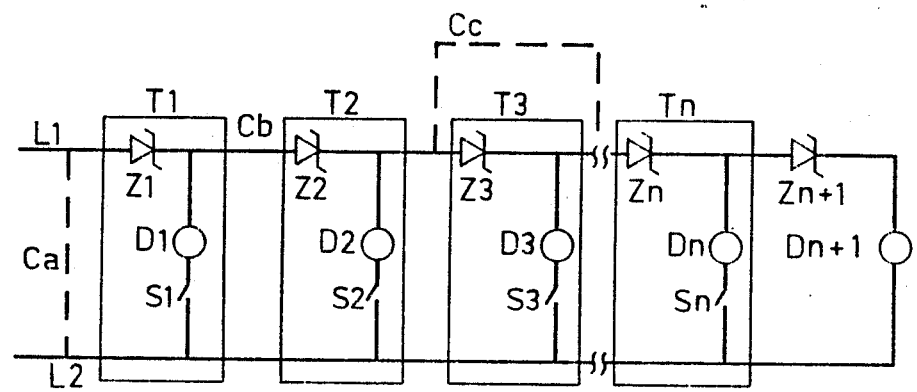
FIG 2

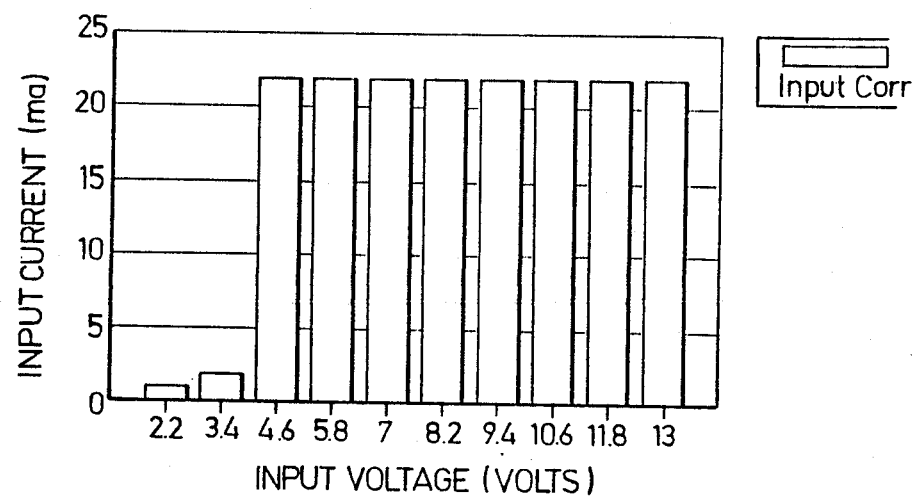
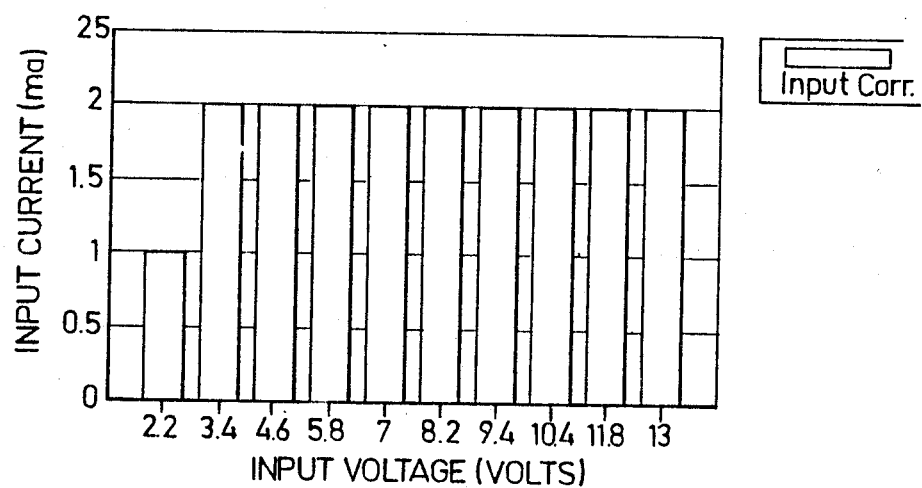
FIG. 6

FIG. 7
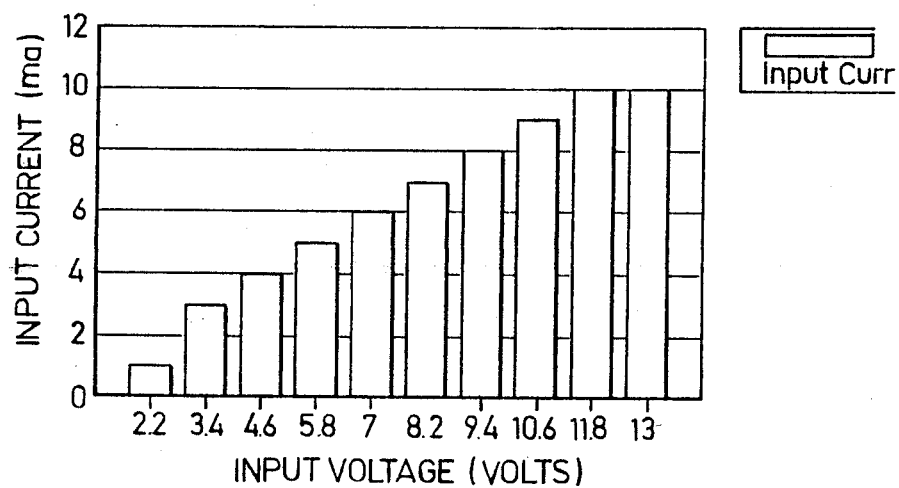
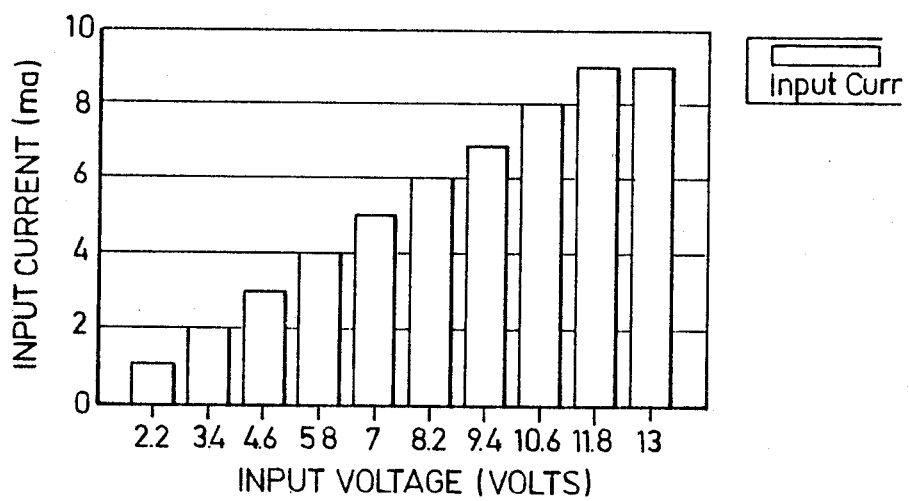
FIG 8

4,918,390

METHOD AND SYSTEM FOR MONITORING THE CONDITION OF A PLURALITY OF ELECTRICAL DEVICES

BACKGROUND OF THE INVENTION

The present invention relates to a method, and also to a system, for monitoring the condition of a plurality of electrical devices. The invention is particularly applicable for monitoring the condition of a plurality of electrical switching devices, such as those operated by sensors, and for determining the location of a malfunctioning device; and the invention is therefore described below with respect to this application.

Switching type sensors for detecting various conditions are commonly used in a wide variety of applications, such as intrusion-detecting systems and fire alarm systems. For example, intrusion-detecting systems frequently use electrical switches for detecting the opening of a door or window. Such systems are commonly equipped with means, such as a continuity detector, to enable the user to determine the condition of all the devices, i.e., whether the switches are all closed. However, the known systems do not usually enable the user to detect whether all of the sensors are functioning properly, i.e., are not shorted, opened or bypassed, or the location of an open or malfunctioning sensor.

BRIEF SUMMARY OF THE INVENTION

An object of the present invention is to provide a method and also a system enabling one to monitor the condition of a plurality of electrical devices. A more particular object is to provide a method and system for monitoring a plurality of electrical switching devices, such as those that may be operated by sensors, to determine the condition of each such switching device, and the location of a switching device which has been found to be malfunctioning.

The present invention provides a method of monitoring a plurality of electrical devices to detect their condition and to determine the location of a malfunctioning device, comprising: connecting the plurality of devices in parallel across two line conductors; for each device, including a voltage-dropping element in series with the line at the input side of the respective device; for each device, including a current-limiting element in series with the respective device, the current-limiting element passing a fixed current independently of voltage above a predetermined threshold; initially applying a voltage to the line of greater magnitude than the sum of the predetermined threshold and the voltage of the voltage-dropping element for the first device; sequentially increasing the applied voltage in a plurality of steps at least equal to the number of devices connected to the line conductors, the voltage in each step being increased to a value greater than the sum of the voltage-dropping elements for the respective device and of all the preceding devices, but less than the latter sum increased by the next device; and measuring the current through the line initially and after each of the voltage steps.

The invention is particularly applicable for monitoring the condition of electrical switching devices, such as those operated by sensors sensing a particular condition and actuating a switch in response to the sensed condition.

In the preferred embodiment of the invention described below, each of the voltage-dropping elements produces the same voltage drop; preferably, a Zener diode is used for this purpose. Also, each of the current-limiting elements is a diode which passes the same fixed current independently of the voltage above the same threshold voltage. By using the same voltage-dropping elements and the same current-limiting elements for all the electrical devices to be tested, the design, manufacture and maintenance of the system is very substantially simplified.

The invention also provides a monitoring system for monitoring the condition of a plurality of electrical devices according to the above-described method.

Further features and advantages of the invention will be apparent from the description below.

BRIEF DESCRIPTION OF THE DRAWINGS

The invention is herein described, by way of example only, with reference to the accompanying drawings, wherein:

FIG. 1 is a block diagram illustrating one form of system constructed in accordance with the present invention;

FIG. 2 is a diagram illustrating the sensor chain in the system of FIG. 1; and

FIGS. 3-8 are diagrams illustrating various conditions as may be sensed by the system of FIGS. 1 and 2.

DESCRIPTION OF A PREFERRED EMBODIMENT

Overall System

Figure 3:
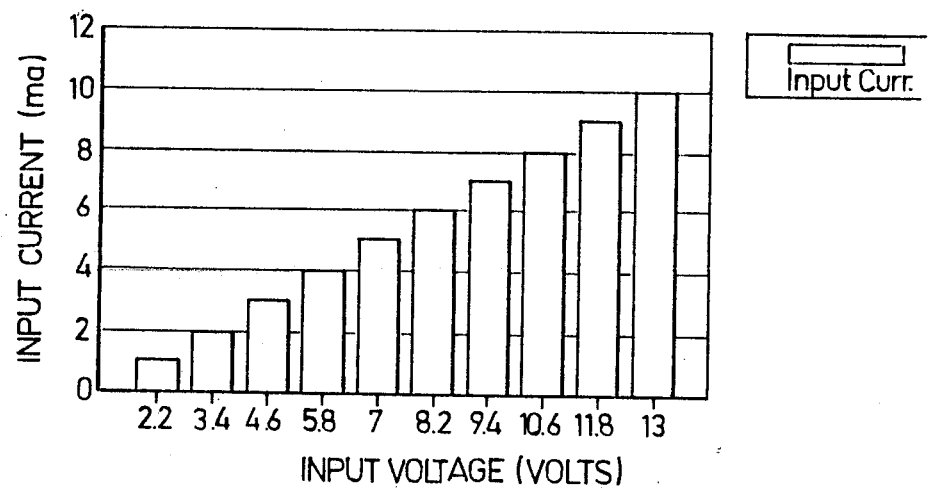

FIG. 1 is a block diagram illustrating one form of monitoring system constructed in accordance with the present invention for monitoring a plurality of electrical devices. In the described preferred embodiment, the electrical devices being monitored are a plurality of sensors each including a switching device which is actuated in response to a sensed condition. For example, the system monitored could be a home-protection system for protecting a home against intrusion, fire and smoke, the system including a plurality of sensors for detecting these various conditions. Each sensor includes an electrical switch which is actuated when the respective condition is sensed.

The sensors, more particularly illustrated in FIG. 2 and therein designated $S_1$-$S_n$, are disposed in a plurality of sections $T_1$-$T_n$ as illustrated in FIG. 1 connected together in the form of a chain. The chain of sections is connected in parallel to a pair of line conductors $L_1$, $L_2$, which are in turn connected to a voltage source VS. The voltage applied by voltage source VS is controlled by a CPU (Central Processor Unit) of a computer via a bus BB, and is also stored in a memory unit MU for processing in a manner to be described more particularly below. The current through the line conductors $L_1$, $L_2$ is measured by a current meter CM, and is also stored in the memory unit MU to be subsequently processed with the voltage readings.

The system illustrated in FIG. 1 further includes a display unit DU for displaying the information measured and processed, and also a mode selector MS for selecting either a Normal mode of operation or a Test mode of operation. During the Test mode of operation, the sensors in the sections $T_1$-$T_n$ are tested to determine the condition (open or closed) of their respective sensor switches, and also to determine whether any one is malfunctioning because it has been shorted, opened or bypassed. During this Test mode, the location of each tested device is also determined, so that in case a tested device is indicated as having an open switch, or as having been shorted, opened or bypassed, the location of such a device will also be indicated to enable the user to identify and correct the tested device.

The Construction of Each Section

FIG. 2 illustrates the construction of each of the sections $T_1$-$T_n$ including the sensors $S_1$-$S_n$ to enable the sensors to be tested in the above-described manner during the Test mode of operation; and FIGS. 3-8 are diagrams illustrating various results obtained during the Test mode to indicate whether one of the sensor switches is open, whether the circuit to a sensor is malfunctioning because it has been shorted, opened or bypassed, and also the location of the sensor which has been found to be open or whose circuit has been found to be malfunctioning.

Thus, as shown in FIG. 2, each of the sensors $S_1$-$S_n$ is illustrated as operating an electrical switch $SW_1$-$SW_n$. In the normal operation of the sensors, these switches would be closed, so that if a particular condition is sensed, e.g., the opening of a window, the respective switch would be open to sound an alarm.

In a typical prior-art testing circuit, these switches would be connected in series with the power supply and with an alarm, so that if they are all closed, continuity is established to the alarm, disabling the alarm from actuation; however, if one of the switches is open, this would open the continuity of the testing circuit, thereby actuating the alarm to indicate this condition to the user. However, this prior-art technique for testing does not indicate where the open switch is located, or whether one of the switches does not function properly, e.g., because of having been bypassed by an intruder disabling the system. The foregoing disadvantages are avoided by the system illustrated in FIG. 2 constructed in accordance with the present invention.

Thus, as shown in FIG. 2, all the switches $SW_1$-$SW_n$ in the respective sections $T_1$-$T_n$ are connected in parallel across the two line conductors $L_1$, $L_2$. In addition, the circuit includes, for each switch $SW_1$-$SW_n$, a voltage-dropping element $Z_1$-$Z_n$ in series with the line at the input side of the switch, and a current-limiting element $D_1$-$D_n$ in series with the respective switch $SW_1$-$SW_n$. Each of the voltage-dropping elements $Z_1$-$Z_n$ produces the same voltage drop; preferably these are Zener diodes all producing the same voltage drop. The current-limiting elements $D_1$-$D_n$ are elements, such as Norton diodes, passing a fixed current independently of the voltage above a predetermined threshold. Preferably, these diodes $D_1$-$D_n$ also pass the same current independently of the voltage above the same predetermined threshold voltage.

The circuit illustrated in FIG. 2 includes a further Zener diode $Z_{n+1}$ at the end of the last section $T_n$, and a further diode $D_{n+1}$ in series with the two line conductors $L_1$, $L_2$ and in parallel with all the sensor-operative switches $SW_1$-$SW_n$. It will be noted that the latter circuit, including Zener diode $Z_{n+1}$ and diode $D_{n+1}$, does not have a sensor-operated switch. This circuit is used for testing the condition of the switch $SW_n$ in the last section $T_n$ of the system, as will be described more particularly below.

Operation

The voltage source VS (FIG. 1) is controlled by the CPU to apply a voltage to line conductors $L_1$, $L_2$ which sequentially increases in a plurality of steps equal to the number of sections $T_1$-$T_n$. The initial voltage applied to the line conductors is of greater magnitude than the sum of the predetermined threshold (e.g., 1 volt) and the voltage of the Zener diode (e.g., 1.2 volts per FIG. 3) of the Zener diode $Z_1$ in the first section $T_1$; and the voltage of each step is increased to a value greater than the sum of the voltages of the Zener diodes for the respective section and all the preceding sections, less than the latter sum increased by the voltage of the Zener diode of the next section.

The current meter CM measures the current through the line conductors initially and after each of the voltage steps. Thus, by comparing the current measured by the current meter CM produced as a result of applying each voltage step, an indication is provided of the condition of the switching devices $SW_1$-$SW_n$ in the sections $T_1$-$T_n$, i.e., whether the switching device is properly closed, or whether the circuit to the switching device is shorted, opened or bypassed. If one of the switching devices is found to be improperly opened, or its circuit has been found to be shorted, opened or bypassed, not only will the measured current readings provide an indication of the condition, but will also provide an indication of where the respective condition exists in the chain of sections $T_1$-$T_n$.

Thus, when a positive voltage, greater than the sum of the threshold (e.g., 1 volt) and the voltage (e.g., 1.2 volts) of the first Zener diode $Z_1$ in section $T_1$, is initially applied across the line conductors $L_1$, $L_2$, the voltage at the output of section $T_1$ equals the input voltage less the voltage drop produced by the Zener diode. If the sensor switch $SW_1$ in section $T_1$ is closed, the current-limiting diode $D_1$ in section $T_1$ will pass a fixed current independently of voltage above a predetermined threshold; this current will be measured by the current meter CM. However, if the sensor switch $SW_1$ in section $T_1$ is open, no current will be drawn through this section. Accordingly, the current produced as a result of the initial voltage step will provide an indication of whether the sensor swtich $SW_1$ in the first section $T_1$ is open or closed.

The same applies with respect to every subsequent voltage step applied to the line conductors $L_1$, $L_2$ since the Zener diodes $Z_1$-$Z_n$ in the respective section $T_1$-$T_n$ being tested will produce a voltage drop less than the voltage step for the respective section, thereby resulting in a flow of current through the sensor switch $SW_1$-$SW_n$ of the respective section if the switch is closed, and no flow of current therein if the switch is open. By thus comparing the current measured by the current meter CM through the line as a result of applying each voltage step, it is possible to determine whether the sensor switch in any of the sections $T_1$-$T_n$ is open or closed, and also the location of an open switch.

The circuit illustrated in FIG. 2 also enables a determination to be made whether one of the sections $T_1$-$T_n$ is malfunctioning because it has been shorted, opened or bypassed. In FIG. 2 the shorting of a section (e.g., the first section $T_1$) is indicated by the broken lines Ca; the opening of a section is indicated by the broken lines Cb; and the bypassing of a section is indicated by the broken lines Cc. Thus:

(a) When a section is shorted (as indicated by broken lines Ca), the voltage step for the preceding section will produce a disproportionate jump in current (to a maximum value) because of the shorting of the respective section, and the current will remain the same for the remaining voltage steps.

(b) When a section is opened (indicated by broken lines Cb), the respective voltage step will produce the same current between it and the immediately preceding one because of the interruption of the line between the tested section and the immediately preceding one. The current from that point will remain the same regardless of the voltage.

(c) When a section is bypassed (indicated by broken lines Cc in FIG. 2), the voltage step will produce a current step which is double with respect to the increase of current in the preceding steps, because of the bypassing of the Zener diode in the respective section.

EXAMPLES OF POSSIBLE CONDITIONS

The following diagrams illustrate various possible conditions that may be present in the system:

FIG. 3 illustrates the condition wherein all the sensor switches $SW_1-SW_n$ are closed, and all the sections $T_1-T_n$ are functioning properly. It will be seen in FIG. 3 that each step in voltage produces a corresponding step in current.

Figure 4:
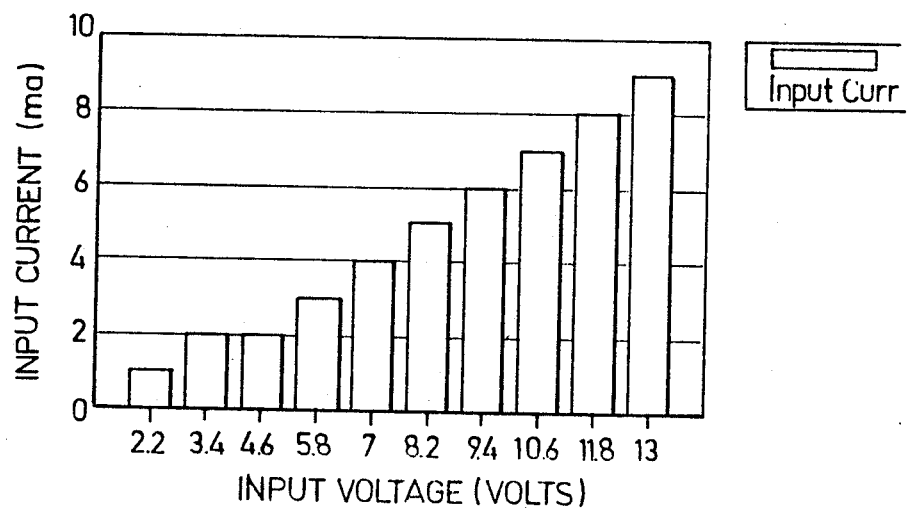

FIG. 4 illustrates the condition wherein sensor switch $SW_3$ is open, and all the other sensor switches are closed. This is indicated by the fact that the current produced in the third voltage step is the same as that in the second voltage step, thereby showing that the sensor switch $SW_3$ in the third section $T_3$ is open and accordingly draws no current.

FIG. 5 illustrates the condition wherein a short (Ca, FIG. 2) is present in the third section $T_3$. This condition is indicated by the fact that the current produced in the third voltage step jumps to maximum, and stays at maximum for the remaining steps, which is what occurs when a short condition is present in the third section.

FIG. 6 illustrates the condition wherein an open circuit (condition Cb in FIG. 2) is present in the third section $T_3$. This condition is indicated by the fact the current produced as a result of the third voltage step is the same as produced in the second voltage step. Because of this open condition in the third section $T_3$, the current will remain the same in all subsequent sections, as also shown in FIG. 6.

FIG. 7 illustrates the condition wherein the second section $T_2$ is bypassed, and the sensor switch $SW_2$ in the respective section is closed. Thus, as shown in FIG. 7, an inordinate increase in current is produced as a result of the application of the second voltage step since the Zener diode $Z_2$ in the second section is bypassed. This increases the voltage applied to the current-limiting diode $D_2$ in that section, and causes the voltage of the input to the third sensor to be such that the current limiting diode $D_3$ is also conducting. Both diodes $D_2$ and $D_3$ start conducting as a result of that voltage step, producing a current step which is double in magnitude. Thereafter, the current increases produced by the subsequent voltage steps are normal and equal.

FIG. 8 illustrates the condition wherein the second section $T_2$ is bypassed (condition Cc in FIG. 2), and the sensor switch $SW_2$ in the second section is open. In such a case, when the second voltage step is applied, the input voltage for the third section is sufficient to cause it to conduct, since the Zener diode in the second section is shorted. The third section acts in effect as through it were the second section, causing a "normal" current step, and the following steps will also appear normal. In the penultimate voltage step, the last section will be activated, and the last voltage step will produce no current change.

The last section $T_n$ in the chain is connected to a Zener diode $Z_{n+1}$ and a current-limiting diode $D_{n+1}$ in series with the two line conductors $L_1$, $L_2$, and in parallel to all the sections $T_1-T_n$, but without a switch corresponding to the sensor switches $SW_1-SW_n$, in order to test the condition of the last sensor switch $SW_n$.

SUMMARY

It will thus be seen that by applying the voltage steps as discussed above, and by measuring the current produced as a result of each voltage step, one is able to quickly determine whether any of the sensor switches $SW_1-SW_n$ is open, and whether any of the sections $T_1-T_n$ is malfunctioning because of being shorted, opened or bypassed. One is also able to determine the location of the open switch or malfunctioning section. The measured currents and voltages may be recorded in the memory unit MU for later analysis, and/or may be displayed in the display unit DU so that the condition can be immediately indicated. It will also be appreciated that the CPU may include an appropriate data processing system which analyses the measured currents produced as a result of each voltage step to provide an indication of the above-described conditions, as well as the location of the respective condition.

While the invention has been described with respect to one preferred embodiment, it will be appreciated that many variations, modifications and other applications of the invention may be made.

What is claimed is:

1. A method of monitoring a plurality of electrical devices to detect their condition and to determine the location of a particular one of said devices, comprising:
   connecting said plurality of devices in parallel across two line conductors;
   for each device, including a voltage-dropping element in series with the line at the input side of the respective device;
   for each device, including a current-limiting element in series with the respective device, said current-limiting element passing a fixed current independently of voltage above a predetermined threshold;
   initially applying a voltage to the line of greater magnitude than the sum of said predetermined threshold and the voltage of the voltage-dropping element for the first device;
   sequentially increasing said applied voltage in a plurality of steps at least equal to the number of devices connected to the line conductors, the voltage in each step being increased to a value greater than the sum of the voltage-dropping elements for the respective devices and of all the preceding devices, but less than the latter sum increased by the voltage of the voltage-dropping element of the next device;
   and measuring the current through the line initially and after each of said voltage steps.

2. The method according to claim 1, wherein said electrical devices are electrical switching devices.

3. The method according to claim 1, wherein the particular device to be located is a malfunctioning device.

4. The method according to claim 2, wherein each of said electrical switching devices is operated by a sensor which senses a predetermined condition.

5. The method according to claim 1, including storing both said measured initial current and the current after each of said voltage steps, and also the voltage initially applied to the line and applied after each of said voltage steps.

6. The method according to claim 1, wherein each of said voltage-dropping elements produces the same voltage drop.

7. The method according to claim 1, wherein each of said current-limiting elements passes the same fixed current independently of the voltage above the same predetermined threshold voltage.

8. The method according to claim 1, wherein the last electrical device whose condition is monitored is followed by a further voltage-dropping element and current-limiting element in parallel with all the electrical devices and in series with the pair of electrical conductors.

9. A monitoring system for monitoring the condition of a plurality of electrical devices, comprising:
 a pair of line conductors connecting the plurality of devices in parallel;
 a voltage-dropping element for each device in series with the line conductors at the input side of its respective device;
 a current-limiting element for each device in series with the respective device, said current-limiting element passing a fixed current independently of the voltage above a predetermined threshold;
 means for initially applying a voltage to the line conductors of greater magnitude than the sum of said predetermined threshold and the voltage of said voltage-dropping element for the first device;
 means for sequentially increasing said applied voltage in a plurality of steps at least equal to the number of devices connected to the line conductors, the voltage in each step being increased to a value greater than the sum of that of the voltage-dropping element for the respective device and for all the preceding devices in the line, but less than the latter sum when added to the voltage of the voltage-dropping element for the next device in the line; and
 measuring the current through the line initially and after each of said voltage steps.

10. The system according to claim 9, wherein said electrical devices are electrical switching devices.

11. The system according to claim 10, wherein each of said electrical devices is operated by a sensor sensing a predetermined condition and actuating its respective electrical switching device in response thereto.

12. The system according to claim 9, further including means for storing both said measured initial current and the current after each of said voltage steps, and also the voltage applied to the line initially and after each of said voltage steps.

13. The system according to claim 9, further including means for displaying the condition of the electrical devices.

14. The system according to claim 9, wherein each of said voltage-dropping elements produce the same voltage drop.

15. The system according to claim 14, wherein all of said voltage-dropping elements are Zener diodes producing the same voltage drop.

16. The system according to claim 9, wherein each of said current-limiting elements passes the same fixed current independently of the voltage above the same predetermined threshold voltage.

17. The system according to claim 16, wherein all said current-limiting elements are Norton diodes.

18. A monitoring system for monitoring a plurality of electrical switching devices, comprising:
 a pair of line conductors connecting the plurality of switching devices in parallel;
 a plurality of voltage-dropping elements of the same value, one in series with the line at the input side of each switching device;
 a plurality of current-limiting elements of the same value, one being connected in series with the respective switching device, and each passing a fixed current independently of voltage above a predetermined threshold;
 means for initially applying to the conductors a voltage of greater magnitude than that of the voltage-dropping elements;
 means for sequentially increasing the applied voltage in a plurality of steps at least equal to the number of switching devices to be monitored, the voltage in each step being increased by an amount greater than that of the voltage-dropping elements; and
 means for measuring the current through the line initially and after each of said voltage steps.

19. The system according to claim 18, wherein all of said voltage-dropping elements are Zener diodes of the same value.

20. The system according to claim 18, wherein all said current-limiting elements pass the same value of current independently of voltage over a predetermined threshold.

21. The system according to claim 18, further including an additional voltage-dropping element and current-limiting element connected in series with the pair of line conductors following all said switching devices and in parallel to all said switching devices and in parallel to all said switching devices.

* * * * *